United States Patent [19]

Jenkinson

[11] Patent Number: 4,484,131
[45] Date of Patent: Nov. 20, 1984

[54] CABLE TESTING

[75] Inventor: Christopher G. Jenkinson, Johannesburg, South Africa

[73] Assignee: Patented Devices (PTY) Limited, Johannesburg, South Africa

[21] Appl. No.: 416,295

[22] Filed: Sep. 9, 1982

[30] Foreign Application Priority Data

Sep. 10, 1981 [ZA] South Africa ............. 81/6280

[51] Int. Cl.³ ............................. G01R 31/08
[52] U.S. Cl. ................... 324/52; 324/58 R
[58] Field of Search .......... 324/52, 58 R, 51; 179/175.3 F; 343/7 R, 17.7

[56] References Cited

U.S. PATENT DOCUMENTS 3,244,975 4/1966 Bauer ..................... 324/52 X

OTHER PUBLICATIONS

Tektronix Catalog—1976—p. 65: 7512 Sampling plug in specifications.

Primary Examiner—Stanley T. Krawczewicz
Assistant Examiner—Jose M. Solis
Attorney, Agent, or Firm—Scully, Scott, Murphy & Presser

[57] ABSTRACT

A pulse echo equipment is provided for automatically impedance matching test leads. Test pulses are applied to test leads and switches 10 and 12 are selectively closed for different short periods of time. The average voltage developed during those periods is applied via a comparator 30 to allow clock pulses to be counted by a counter 34 and to vary the effective impedance of a matching circuit by supplying a current to a lamp 40. A light sensitive resistor 42 is part of the matching circuit of the equipment.

7 Claims, 2 Drawing Figures

CABLE TESTING

BACKGROUND OF THE INVENTION

The invention relates to cable testing.

The invention has a particular application in association with pulse echo techniques where locating cable faults is carried out by timing the period taken for a test pulse to travel along a cable and an echo pulse to return from the fault. For example in order that the start of the cable does not itself appear as an apparent fault in such testing the equipment must be impedance matched so that there are no echo pulses generated at the junction of the cable and test equipment, assuming there is no fault at this point.

For a general explanation of pulse echo techniques reference can be made to South African patent specification No. 64/4200. In that patent specification or other pulse echo technique arrangements some form of automatic impedance matching is preferably required especially as the matching may vary as different cables are tested. Further, test leads are often required between the testing equipment and the cable and this produces problems in operating the equipment.

However, the invention has more general application enabling the determining of impedance characteristics at selected sections along a length of cable.

SUMMARY OF THE INVENTION

According to the invention there is provided a pulse echo equipment including a transmitter arranged to apply test pulses to an end of a cable system, circuit means arranged to receive echo pulses generated in the cable system and a voltage measuring circuit arranged to measure the average voltage of echo pulses arranged to monitor the echo pulses over a very short interval of time selectively interspaced between the application of test pulses, the voltage measured being dependent on the impedance characteristics of a selected short length of the cable.

The voltage measuring circuit may be arranged to monitor average voltages over two very short periods of time, one of which periods being during a dead period such that the voltage measured represents a datum against which the other voltage is compared.

The voltage measuring circuit may include controllable switch means arranged to be closed for the very short period or periods of time to allow voltages in the cable to cause a flow of current to a capacitor means, the voltages stored in the capacitor means representing the average voltage of the echo pulses.

Two short intervals of time may be monitored, in which two switching circuits are provided one for each period and separate capacitor means are supplied via each switching means, including a comparator circuit for comparing the voltage of each capacitor and providing an output signal corresponding to a difference between the voltages of the two capacitors.

The pulse echo equipment may include a matching impedance network and means for adjusting the impedance thereof in response to the average voltage measured by the voltage measuring circuit.

A repetitive test signal may be applied and the voltage of the echo pulses is repetitively monitored in which the means for adjusting the matching impedance is arranged to automatically adjust the matching impedance until the measured average voltage is reduced to a minimum magnitude.

A variable resistive device may be included and the means for adjusting the matching impedance is arranged to adjust that impedance by adjusting the variable resistive device.

The variable resistive device may comprise a light emitter to which a variable current can be supplied, which is controlled by the adjusting means, and an associated light dependent resistor forming part of the matching impedance.

BRIEF DESCRIPTION OF THE DRAWING

An automatic impedance matching circuit, for pulse echo equipment, according to the invention will now be described by way of example with reference to the accompanying schematic circuit diagram of FIG. 1 and the accompanying illustration of FIG. 2 which illustrates schematically a typical pulse transmitter and echo detecting arrangement.

DESCRIPTION OF A PREFERRED EMBODIMENT

When the equipment is properly adjusted its output impedance matches the characteristic impedance of the cable. The matching is provided by an impedance in the comparison circuit of the equipment. Thus, when a pulse is applied to the start of the cable, no echo pulse is seen by the equipment. If a pulse train is applied to a non-faulty and so-called "infinitely long" cable with properly matched impedance the instantaneous and average net voltage measured by the equipment is at all times zero. This is a somewhat idealised situation and in practice perfect matching is not usually possible especially when dealing with normal cables.

This embodiment of the present invention enables a comparison of the average net voltage normally in two short time sampling intervals (although more than two intervals may be used) for each pulse of a test pulse train and chooses spaced and equal time intervals, one corresponding to a short time period almost simultaneous with the application of each test pulse and the other corresponding to a so-called "dead period" which occurs a selected time interval after the application of each of the test pulses. If the mean voltages of the sampled perios are at least substantially equal, the output impedance of the equipment is sufficiently impedance matched to the cable or part of the cable such that fault detection and location can be carried out satisfactorily. If near matching is not achieved, an echo pulse from the start of the line, say, may interfere with proper observation of echo pulses from faults or other impedance irregularities.

Figure 2:
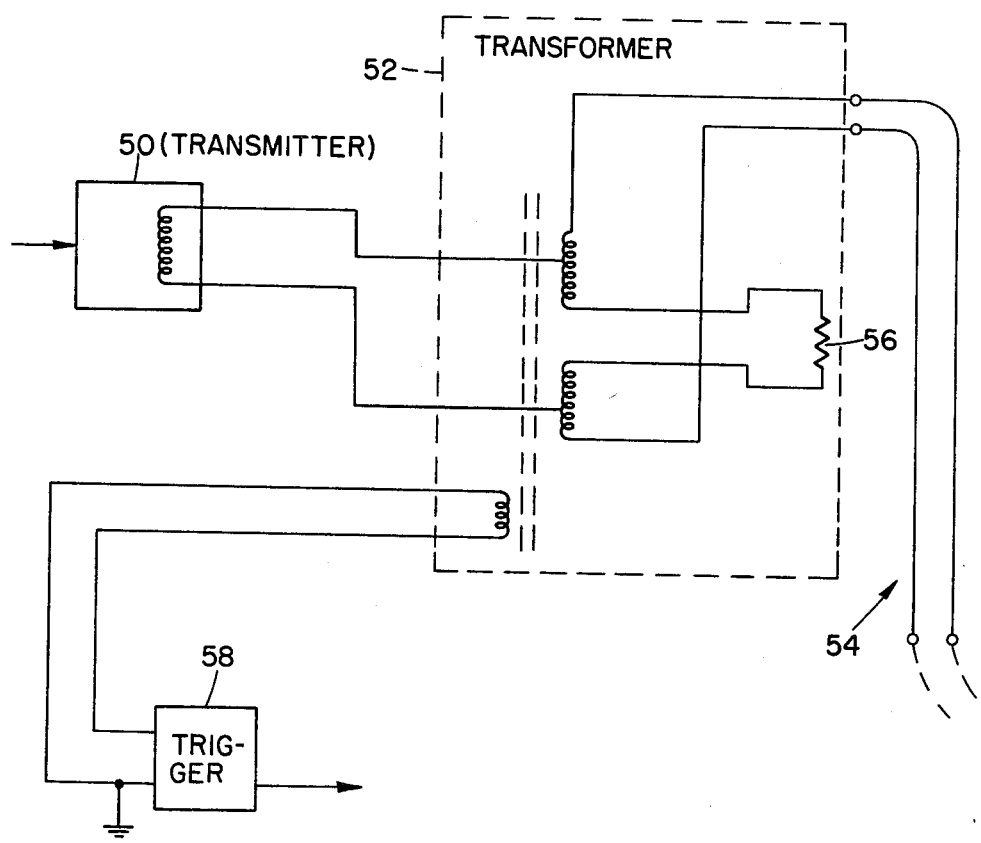

Referring to FIG. 2, a typical pulse transmitter and echo detecting arrangement is illustrated in which a transmitter 50 is provided for generating pulses to be applied to a test cable via a transformer network 52 and test leads 54. A matching resistor 56 is provided in a measuring network so that normally no echo pulse is generated by the connection of the test leads to the equipment. In this arrangement, echo pulses received back through the test leads 54 are detected by a coil of the transformer network 52 which can be coupled to a Schmitt trigger 58 for further signal processing.

Figure 1:
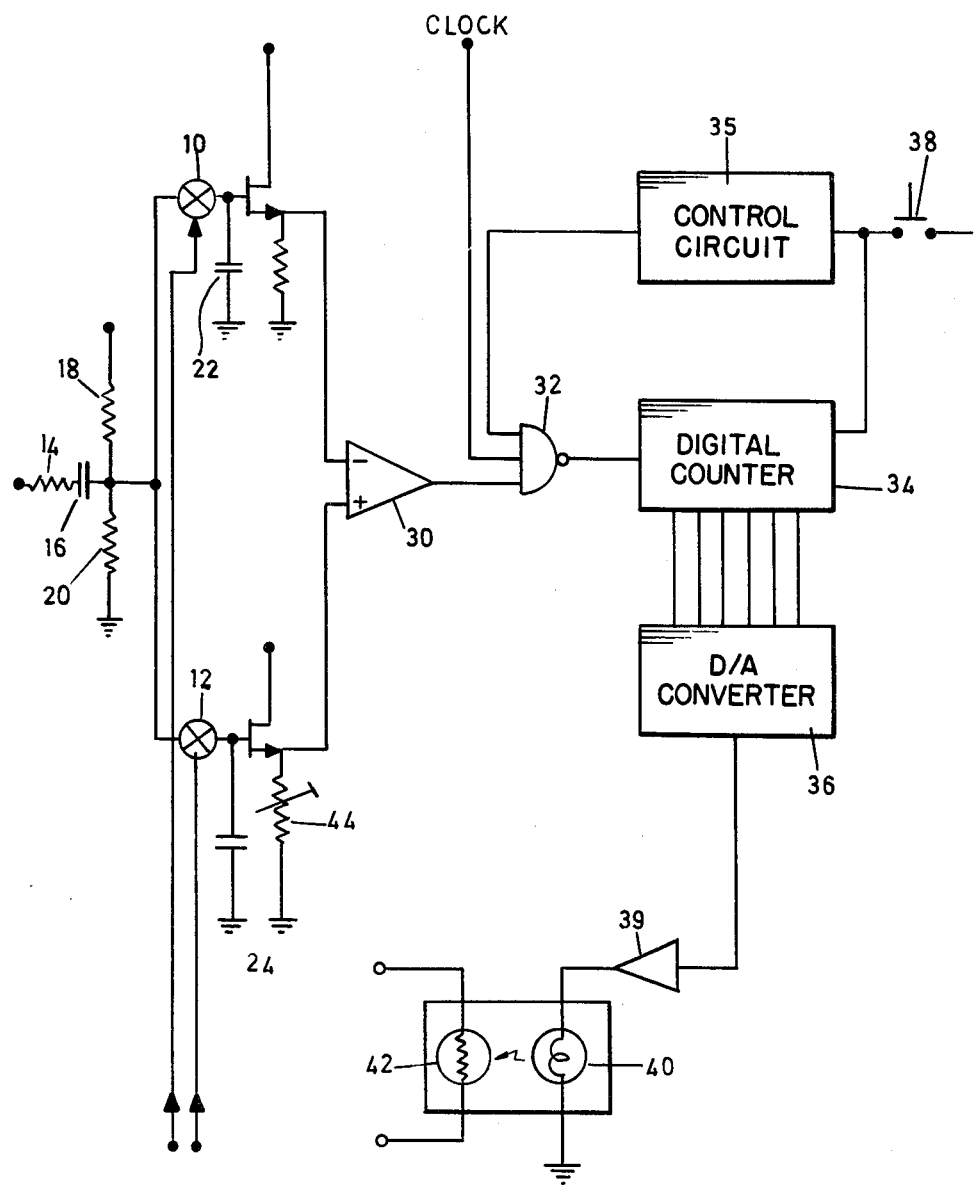

Referring to FIG. 1, switches 10 and 12 are arranged to be switched on for 500 nanoseconds, switch 10 for a 500 nanosecond period close to and usually coincident with the application of a test pulse and during a dead period respectively. A dead period just before the occurrence of a next test pulse is preferred. The line voltage is applied via a resistor 14 and biassing network, comprising a capacitor 16 and resistors 18 and 20, to switches 10 and 12.

The outputs of the switches 10 and 12 are supplied to capacitors 22 and 24 and through FET's 26 and 28 respectively to a comparator 30. If the voltages supplied to the comparator 30 are not equal a gate 32 is opened to allow clock pulses to be supplied to a digital counter 34, controlled by a control circuit 35 and reset-button 38. The output of the counter 34 is converted to a corresponding analogue signal by a convertor 36 which controls via a buffer 39 current supplied to a lamp 40. A light dependent resistor 42 adjacent to the lamp 40 provides a "matching impedance" for the equipment.

In most practical situations a matching resistor is considered capable of providing the impedance matching. However, the described arrangement may be used to alter a variable impedance, instead of the resistor 42.

Thus, sample voltages are compared by the circuit for the selected short intervals of time within the test pulse cycle. The resistor 14 together with each of the capacitors 22 and 24 in turn comprise low pass filters which store the average voltages on the capacitors 22 and 24 for each respective sample or integration period. A variable resistor 44 is provided for calibration. The FET's 26 and 28 act as voltage followers to apply the voltages on the capacitors 22 and 24 to the input of the comparator 30.

Thus, the line voltages are sampled at the beginning of a test procedure and during a test period, and the resistor 42 automatically adjusted until the sampled line voltages are at least substantially equal. The value of the resistance of the resistor 42 is then at its optimum value to provide the impedance matching required in the equipment. Thereafter the resistance can be locked by the control circuit 35 or recalibrated as required by using the reset-button and repeating the procedure.

Normally in practice, the equipment is connected to a cable by test leads so that the impedance characteristics of the test leads must also be matched in the equipment. The impedance characteristic of the test leads or for any particular test leads used are known or determinable and if preferred a dummy impedance network having reactive components can be provided in another embodiment of the invention independently of and associated with the matching impedance described. In this way echo pulses generated as a result of the presence of the test leads themselves can be cancelled in the equipment. Further, it is possible to provide a time dependent impedance network so that echo pulses generated at the connections between the equipment and the test leads and the test leads and the cable are simultaneously cancelled out. This enables more successful adjustment of the impedance, the resistor 42 in the described embodiment, to match the impedance of the cable alone.

The equipment may be arranged with a visual indicating device, for example, to indicate that successful matching has been achieved. Clearly there are practical limits in adjusting the matching resistor (or impedance) and if matching is not possible it is advantageous to indicate such a condition to an operator.

The automatic impedance matching circuit described above is a particular form of carrying out the invention. The invention can have a more general application and embodiments of the invention can be provided for determining an impedance irregularity or the general condition of selected sections of a cable along its length. To explain the general application it will be noted that the average voltage developed by any echo pulse, or the fact that no voltage has been developed because there is no discernible echo pulse or change of impedance, represents the voltage developed during a selected interval of time. This developed voltage is the voltage developed during the period for which the switch 10 is closed. It is normally necessary in addition in practice in embodiments of the invention to derive the cable voltage when the switch 12 is closed to provide a practical datum against which the voltage developed across the capacitor 22 can be compared. However, in a more idealised situation and perhaps in some practical situations the voltage developed across, say, the capacitor 22 can be relied upon in isolation of the voltage across capacitor 24. Thus, an embodiment of the invention can be provided in which the voltage across the capacitor 22 (although there are other ways of course of sensing the cable or line voltage) is used as compared to say zero volts to determine the condition of a cable over a selected section of the cable.

The length of the section of cable inspected is determined by the period of time for which the switch 10 is closed. There are practical limitations because a voltage can only be sensed over a finite time and also the speed of secure operation of available switches must be taken into consideration. In the described example the switch is closed for periods of 500 nanoseconds and this represents, depending on different cables, around a 50 meter length of cable. That is, 50 meters of cable delays the return of the echo pulse by 500 nanoseconds. This means that the section of cable over which the voltage across the capacitor is developed is 50 meters long and it is the condition of that 50 meters which the voltage developed across the capacitor 22 (or the count in the counter 34) represents. If there is a dramatic fault in that section a significant voltage will be developed and if there is no impedance irregularity or change within that section the voltage developed across the capacitor 22 should be substantially zero volts.

It is clear therefore that an embodiment of the invention can be used for determining the condition of a selected section of the length of cable. The particular section selected is determined by the time interval between applications of test pulses and the moment of time relative thereto of the closing of the switch 10.

For example, if the switch 10 is closed 500 nanoseconds after the application of each test pulse to, say, a post office communication cable having PVC insulation, the section of cable "looked at" starts 50 meters from the end of the cable and extends to 50 meters beyond that point. If the switch 10 is closed 5000 nanoseconds after the application of the test pulse a section of cable extending from about 500 to 550 meters is "looked at" by the equipment provided.

Thus it will be appreciated that whereas an automatic impedance matching circuit has been specifically described with reference to the drawing, other embodiments of the invention to inspect or "look at" specific sections of a cable can also be provided in accordance with the invention. It will be noted that in the impedance matching embodiment as described the effective point of matching along the cable is determined by the interval of time of between the occurrance of each test pulse and the closing of the switch 10. In a preferred arrangement that interval is preferably reduced to zero time so that the impedance matching takes place for the average impedance of the first 50 meters extending from the end of the cable.

In the event of the cable being shorter than 50 meters the circuit is provided with a discriminating circuit network which effectively shortens the sampling period (500 nanoseconds in the example) so as to exclude the voltage developed by an echo pulse from the end of the cable. This can be achieved for example by arranging the discriminating network to open the switch 10 before the end of the 500 nanosecond time period of its normal closed period.

In summary, the circuit of the present invention can be utilized in one particular application to impedance match the test equipment and test leads to the characteristic impedance of the cable being tested, or can be utilized in a more general application to determine an impedance irregularity along selected sections of the length of the cable.

The switch 12 is controlled to develop a reference voltage on capacitor 24 representative of the characteristic impedance of the cable. To accomplish this, the switch 12 is opened briefly (for example for 500 nanoseconds) to look at a reference (or dead) section of the cable as a reference. Explained in greater detail, the switch 12 is controlled to develop a datum voltage on capacitor 24 representative of the steady-state voltage of the unexcited cable. To accomplish this, the switch 12 is opened briefly (for example for 500 nanoseconds) to look at an unexcited (or dead) section of the cable as a datum. The switch 12 can be opened briefly to look at the characteristic voltage on the entire cable during a period when all voltage reflections are expected to have substantially died away.

The switch 10 is controlled to develop a voltage on capacitor 22 representative of the reflections of another section of the cable being tested. In the special application mentioned above, this other section could be in the test leads to impedance match the test equipment to the characteristic impedance of the cable.

The circuit is controlled by control circuit 35 and reset button 38 such that if the voltages supplied to comparator 30 by capacitors 22 and 24 are not equal, gate 32 is opened to allow clock pulses to increment the digital counter 34. The count in the incremented counter 34 is converted to an analog value by 36 and applied through 39 to lamp 40, the light output of which is increased in proportion to the count to adjust the resistance of a light sensitive variable resistor 42 in the test equipment to change the impedance of the equipment.

If during this adjustment, the impedance of the test equipment matches the characteristic impedance of the cable, the output of comparator 30 is disabled to disable the output of AND gate 32 and thus, the counter in counter 34 remains fixed at that count wherein impedance matching occurred, or until reset button 38 is actuated again.

I claim:

1. Pulse echo equipment, comprising a transmitter arranged to apply test pulses to an end of a cable system, and circuit means arranged to receive echo pulses generated in the cable system, said circuit means including an impedance matching network for matching of the impedance of the cable being tested, and including a voltage measuring circuit arranged to measure the average voltage of echo pulses, over first and second very short intervals of time selectively interspaced between the application of test pulses, the voltage measured being dependent on the impedance characteristics of first and second selected short lengths of cable, a matching impedance network, and means for adjusting the impedance of said matching impedance network in response to a comparison of the average voltages measured over the first and second intervals of time by the voltage measuring circuit.

2. A pulse echo equipment according to claim 1 in which the voltage measuring circuit is arranged to monitor average voltages over two very short periods of time, one of which periods being during a dead period and such that the voltage measured represents a datum against which the other voltage is compared.

3. A pulse echo equipment according to claim 2, in which the voltage measuring circuit includes controllable switch means arranged to be closed for the very short periods of time to allow voltages in the cable to cause a flow of current to a capacitor means, the voltages stored in the capacitor means representing the average voltage of the echo pulses.

4. A pulse echo equipment according to claim 3 in which two short intervals of time are monitored, in which two switching circuits are provided one for each period and separate capacitor means are supplied via each switching means, including a comparator circuit for comparing the voltage of each capacitor and providing an output signal corresponding to a difference between the voltages of the two capacitors.

5. A pulse echo equipment according to claim 1 and in which a repetitive test signal is applied and the voltage of the echo pulses is repetitively monitored in which the means for adjusting the matching impedance is arranged to automatically adjust the matching impedance until the measured average voltage is reduced to a minimum magnitude.

6. A pulse echo equipment according to claim 5 including a variable resistive device and the means for adjusting the matching impedance is arranged to adjust that impedance by adjusting the variable resistive device.

7. A pulse echo equipment according to claim 6, in which the variable resistive device comprises a light emitter to which a variable current can be supplied, which is controlled by the adjusting means, and an associated light dependent resistor forming part of the matching impedance.

* * * * *